United States Patent
Yamaguchi et al.

(10) Patent No.: US 6,744,075 B2
(45) Date of Patent: Jun. 1, 2004

(54) NITRIDE-BASED SEMICONDUCTOR LIGHT-EMITTING DEVICE AND METHOD OF FORMING THE SAME

(75) Inventors: Tsutomu Yamaguchi, Nara (JP); Kiyoshi Oota, Neyagawa (JP); Yasuhiko Nomura, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/244,448

(22) Filed: Sep. 17, 2002

(65) Prior Publication Data

US 2003/0052322 A1 Mar. 20, 2003

(30) Foreign Application Priority Data

Sep. 17, 2001 (JP) .......................................... 2001-281296

(51) Int. Cl.[7] ............................................... H01L 27/15
(52) U.S. Cl. ............................. 257/99; 257/94; 257/103
(58) Field of Search ........................... 257/13, 79–103, 257/918

(56) References Cited

U.S. PATENT DOCUMENTS

| 5,767,536 | A | * | 6/1998 | Murakami et al. ............ 257/99 |
| 5,990,500 | A | | 11/1999 | Okazaki |
| 6,172,382 | B1 | * | 1/2001 | Nagahama et al. ........... 257/94 |
| 6,291,840 | B1 | | 9/2001 | Uemura et al. |

| 2003/0047743 | A1 | * | 3/2003 | Li ................................ 257/96 |

FOREIGN PATENT DOCUMENTS

| JP | 6-152072 | 5/1994 |
| JP | 9-293898 | 11/1997 |
| JP | 10-163259 | 6/1998 |
| JP | 2000-196201 | 7/2000 |
| JP | 2000-252230 | 9/2000 |

* cited by examiner

Primary Examiner—Long Pham
Assistant Examiner—Marcos D. Pizarro-Crespo
(74) Attorney, Agent, or Firm—McDermott, Will & Emery

(57) ABSTRACT

A nitride-based semiconductor light-emitting device having low operating voltage with high reliability is obtained by improving adhesion of the whole of an electrode layer to a nitride-based semiconductor layer without damaging a low contact property. This nitride-based semiconductor light-emitting device comprises the nitride-based semiconductor layer formed on an active layer and the electrode layer partially formed on the nitride-based semiconductor layer. The electrode layer includes a first electrode layer containing a material having strong adhesion to the nitride-based semiconductor layer and a second electrode layer formed on the first electrode layer to have a portion coming into contact with the surface of the nitride-based semiconductor layer with weaker adhesion to the nitride-based semiconductor layer than the first electrode layer for reducing contact resistance of the electrode layer to the nitride-based semiconductor layer.

21 Claims, 16 Drawing Sheets

NITRIDE-BASED SEMICONDUCTOR LIGHT-EMITTING DEVICE AND METHOD OF FORMING THE SAME

BACKGROUND OF THE INVENTION

1. Field of the Invention

The present invention relates to a nitride-based semiconductor light-emitting device and a method of forming the same, and more particularly, it relates to a nitride-based semiconductor light-emitting device including an electrode layer and a method of forming the same.

2. Description of the Background Art

A nitride-based semiconductor laser element, which is an exemplary nitride-based semiconductor light-emitting device, is expected as the light source for an advanced large capacity optical disk and actively developed nowadays. In order to reduce the operating voltage of the nitride-based semiconductor laser element and improve reliability thereof, the contact resistance of electrodes must essentially be reduced. In particular, a nitride-based semiconductor has a low p-type carrier concentration and hence it is difficult to obtain an excellent ohmic property (low contact resistance) in relation to a p-side electrode. In order to cope with this, a Pd-based electrode material such as a Pd/Au electrode or a Pd/Pt/Au electrode containing Pd having an excellent ohmic property has been recently employed as the p-side electrode.

FIG. 28 is a sectional view showing a conventional nitride-based semiconductor laser element 150 having a Pd-based electrode. The structure of the conventional nitride-based semiconductor laser element 150 is now described with reference to FIG. 28. In the conventional nitride-based semiconductor laser element 150, an AlGaN low-temperature buffer layer 102 having a thickness of about 15 nm is formed on a sapphire substrate 101. An undoped GaN layer 103 having a thickness of about 3 μm is formed on the AlGaN low-temperature buffer layer 102. An n-type GaN contact layer 104 is formed on the undoped GaN layer 103 with a thickness of about 5 μm. An n-type AlGaN cladding layer 105 having a thickness of about 1 μm, an MQW (multiple quantum well) emission layer 106 of InGaN having a thickness of about 50 nm and a p-type AlGaN cladding layer 107 of about 300 nm in thickness having a projection portion are formed on the n-type GaN contact layer 104. A p-type GaN contact layer 108 having a thickness of about 70 nm is formed on the projection portion of the p-type AlGaN cladding layer 107.

A p-side electrode 109 consisting of a Pd-based electrode having a three-layer structure of a Pd layer of about 10 nm in thickness, an Au layer of about 100 nm in thickness and an Ni layer of about 200 nm in thickness in ascending order is formed on the p-type GaN contact layer 108. An SiO$_2$ film 110 is formed to cover regions other than part of the upper surface of the p-side electrode 109 and the upper surface of the n-type GaN contact layer 104. A pad electrode 111 is formed to cover the SiO$_2$ film 110 while coming into contact with the upper surface of the p-side electrode 109.

Partial regions of the layers from the p-type AlGaN cladding layer 107 to the n-type GaN contact layer 104 are removed. An n-side electrode 112 is formed to be in contact with an exposed part of the upper surface of the n-type GaN contact layer 104. A pad electrode 113 is formed to be in contact with the n-side electrode 112.

FIGS. 29 to 33 are sectional views for illustrating a process of fabricating the conventional nitride-based semiconductor laser element 150 having the Pd-based electrode shown in FIG. 28. FIG. 34 is a sectional view showing the conventional nitride-based semiconductor laser element 150 shown in FIG. 28 in a state mounted on a submount 170 from the side of an active layer in a junction-up system. The fabrication process for the conventional nitride-based semiconductor laser element 150 having the Pd-based electrode is now described with reference to FIGS. 28 to 34.

First, the AlGaN low-temperature buffer layer 102 is grown on the sapphire substrate 101 by MOCVD under a low temperature condition of about 600° C. in order to relax lattice mismatching, as shown in FIG. 29. The undoped GaN layer 103 is formed on the AlGaN low-temperature buffer layer 102 with the thickness of about 3 μm by MOCVD.

Thereafter the n-type GaN contact layer 104 having the thickness of about 5 μm, the n-type AlGaN cladding layer 105 having the thickness of about 1 μm, the MQW emission layer 106 having the thickness of about 50 nm, the p-type AlGaN cladding layer 107 having the thickness of about 300 nm and the p-type GaN contact layer 108 having the thickness of about 70 nm are successively formed on the undoped GaN layer 103 by MOCVD.

Then, partial regions of the layers from the p-type GaN contact layer 108 to the n-type GaN contact layer 104 are removed by anisotropic dry etching, as shown in FIG. 30.

Then, the Pd layer of about 10 nm in thickness, the Au layer of about 100 nm in thickness and the Ni layer of about 200 nm in thickness are formed in ascending order in a striped shape of about 2 μm in width by a lift off method or the like, thereby forming the p-side electrode 109 consisting of the Pd-based electrode having the three layer structure of the Pd layer, the Au layer and the Ni layer as shown in FIG. 31. Thereafter the uppermost Ni layer of the p-side electrode 109 is employed as an etching mask for etching the p-type GaN contact layer 108 by anisotropic dry etching employing CF$_4$ gas while etching the p-type AlGaN cladding layer 107 by about 150 nm. Thus, a ridge portion is formed as shown in FIG. 32.

Then, the SiO$_2$ film 110 is formed on the overall surface by plasma CVD, and thereafter partially removed from the part of the n-type GaN contact layer 104 as shown in FIG. 33. The n-side electrode 112 is formed on the part of the n-type GaN contact layer 104 from which the SiO$_2$ film 110 is partially removed.

Finally, the SiO$_2$ film 110 is partially removed from the upper surface of the p-side electrode 109 consisting of the Pd-based electrode, followed by formation of the pad electrodes 111 and 113 on the p-side electrode 109 and the n-side electrode 112, as shown in FIG. 28.

The nitride-based semiconductor laser element 150 shown in FIG. 28 is fixed onto the submount (heat radiation base) 170 fixed to a stem 171 with a fusing material 160 such as solder, as shown in FIG. 34. In this case, the surface (the back surface of the sapphire substrate 101) of the element 150 opposite to the ridge portion is welded to the submount 170 in the junction-up system.

The conventional nitride-based semiconductor laser element 150 having the p-side electrode 109 consisting of the Pd-based electrode is formed in the aforementioned manner.

In the aforementioned conventional nitride-based semiconductor laser element 150 having the p-side electrode 109 consisting of the Pd-based electrode, however, the p-side electrode 109 consisting of the Pd-based electrode tends to peel during the fabrication process due to weak adhesion to the p-type GaN contact layer 108. Therefore, it is disadvantageously difficult to improve reliability of the element 150.

In the conventional nitride-based semiconductor laser element 150 having the p-side electrode 109 consisting of the Pd-based electrode, further, the contact property of the p-side electrode 109 is disadvantageously deteriorated due to heat or stress in a step of forming the pad electrode 112 on the p-side electrode 109 or an assembling step. In this case, contact resistance is so increased as to disadvantageously increase the operating voltage.

SUMMARY OF THE INVENTION

An object of the present invention is to provide a highly reliable nitride-based semiconductor light-emitting device having low operating voltage.

Another object of the present invention is to increase adhesion of the whole of an electrode layer to a nitride-based semiconductor layer without damaging a low contact property in the aforementioned nitride-based semiconductor light-emitting device.

Still another object of the present invention is to provide a method of forming a nitride-based semiconductor light-emitting device capable of easily forming a highly reliable nitride-based semiconductor light-emitting device having low operating voltage.

A nitride-based semiconductor light-emitting device according to a first aspect of the present invention comprises a nitride-based semiconductor layer formed on an active layer and an electrode layer partially formed on the nitride-based semiconductor layer, while the electrode layer includes a first electrode layer containing a material having strong adhesion to the nitride-based semiconductor layer and a second electrode layer formed on the first electrode layer to have a portion coming into contact with the surface of the nitride-based semiconductor layer with weaker adhesion to the nitride-based semiconductor layer than the first electrode layer for reducing contact resistance of the electrode layer to the nitride-based semiconductor layer.

As hereinabove described, the nitride-based semiconductor light-emitting device according to the first aspect is partially provided on the nitride-based semiconductor layer with the first electrode layer containing the material having strong adhesion to the nitride-based semiconductor layer and provided on the first electrode layer with the second electrode layer, reducing contact resistance to the nitride-based semiconductor laser, having the portion coming into contact with the surface of the nitride-based semiconductor layer, whereby the first electrode layer can increase adhesion of the overall electrode layer to the nitride-based semiconductor layer while the second electrode layer can attain low contact resistance. Thus, reliability of the device can be improved while operating voltage can be reduced.

In the aforementioned nitride-based semiconductor light-emitting device according to the first aspect, the second electrode layer preferably has lower contact resistance to the nitride-based semiconductor layer than the first electrode layer. According to this structure, the second electrode layer can easily attain low contact resistance.

In the aforementioned nitride-based semiconductor light-emitting device according to the first aspect, the first electrode layer preferably contains at least one material selected from a group consisting of Pt, Ni, Cr, Ti, Hf and Zr, and the second electrode layer preferably contains Pd. In this case, the first electrode layer more preferably includes a Pt layer, and the second electrode layer more preferably includes a multilayer film having a Pd layer. According to this structure, the first electrode layer can easily improve adhesion of the overall electrode layer to the nitride-based semiconductor layer, and the second electrode layer can easily attain low contact resistance.

In the aforementioned nitride-based semiconductor light-emitting device according to the first aspect, the first electrode layer is preferably partially formed on the nitride-based semiconductor layer in heterogeneous distribution. According to this structure, the second electrode layer can come into contact with the nitride-based semiconductor layer on a region of the nitride-based semiconductor layer formed with no first electrode layer, whereby contact resistance of the second electrode layer can be easily reduced.

In this case, the first electrode layer is preferably formed on the nitride-based semiconductor layer with a thickness of not more than 3 nm. According to this structure, the first electrode layer can be easily formed on the nitride-based semiconductor layer with islandlike heterogeneous distribution.

In the aforementioned nitride-based semiconductor light-emitting device according to the first aspect, the first electrode layer is preferably formed by patterning. According to this structure, the first electrode layer can be partially formed on a prescribed region of the nitride-based semiconductor layer.

In the aforementioned nitride-based semiconductor light-emitting device according to the first aspect, the nitride-based semiconductor layer preferably has an irregular surface. According to this structure, the contact areas between the nitride-based semiconductor layer and the first and second electrode layers can be increased, whereby the contact area between the nitride-based semiconductor layer and the second electrode layer can be inhibited from reduction resulting from formation of the second electrode layer on the nitride-based semiconductor layer through the first electrode layer. Thus, contact resistance can be stably reduced. In this case, the nitride-based semiconductor layer having the irregular surface preferably has an In composition of at least 3% and a thickness of not more than 20 nm. When the nitride-based semiconductor layer is formed with such a composition and such a thickness, the surface of the nitride-based semiconductor layer can be easily irregularized.

In the aforementioned nitride-based semiconductor light-emitting device according to the first aspect, the nitride-based semiconductor layer preferably includes a contact layer formed on a projection portion of a cladding layer, and the projection portion of the cladding layer and the contact layer preferably form a ridge portion. While an electrode must be formed on the contact layer having a narrow area in this structure, the first electrode layer can improve adhesion of the overall electrode layer to the contact layer forming the ridge portion and the second electrode layer can attain low contact resistance. Consequently, operating current and operating voltage can be reduced, whereby the device can be improved in reliability.

In the aforementioned nitride-based semiconductor light-emitting device according to the first aspect, the second electrode layer preferably has a lower energy barrier to the nitride-based semiconductor layer than the first electrode layer. According to this structure, the second electrode layer can easily attain low contact resistance.

A nitride-based semiconductor light-emitting device according to a second aspect of the present invention comprises a nitride-based semiconductor layer formed on an active layer and an electrode layer formed on the nitride-based semiconductor layer, while the electrode layer includes a first electrode layer containing a material having strong adhesion to the nitride-based semiconductor layer and a second electrode layer formed on the first electrode layer to have a portion coming into contact with the surface of the nitride-based semiconductor layer with weaker adhesion to the nitride-based semiconductor layer than the first electrode layer for reducing an energy barrier of the electrode layer to the nitride-based semiconductor layer.

The nitride-based semiconductor light-emitting device according to the second aspect is partially provided on the surface of the nitride-based semiconductor layer with the first electrode layer containing the material having strong adhesion to the nitride-based semiconductor layer and provided on the first electrode layer with the second electrode layer reducing the energy barrier to the nitride-based semiconductor layer as hereinabove described, whereby the first electrode layer can improve adhesion of the overall electrode layer to the nitride-based semiconductor layer and the second electrode layer can attain low contact resistance. Thus, the device can be improved in reliability and operating voltage can be reduced.

In the aforementioned nitride-based semiconductor light-emitting device according to the second aspect, the second electrode layer preferably has lower contact resistance to the nitride-based semiconductor layer than the first electrode layer. According to this structure, the second electrode layer can easily attain low contact resistance.

In the aforementioned nitride-based semiconductor light-emitting device according to the second aspect, the first electrode layer preferably contains at least one material selected from a group consisting of Pt, Ni, Cr, Ti, Hf and Zr, and the second electrode layer preferably contains Pd. In this case, the first electrode layer more preferably includes a Pt layer, and the second electrode layer more preferably includes a multilayer film having a Pd layer. According to this structure, the first electrode layer can easily increase adhesion of the overall electrode layer to the nitride-based semiconductor layer, and the second electrode layer can attain low contact resistance.

In the aforementioned nitride-based semiconductor light-emitting device according to the second aspect, the first electrode layer is preferably partially formed on the nitride-based semiconductor layer in heterogeneous distribution. According to this structure, the second electrode layer can come into contact with the nitride-based semiconductor layer on a region of the nitride-based semiconductor layer formed with no first electrode layer, whereby the second electrode layer can easily reduce contact resistance.

In this case, the first electrode layer is preferably formed on the nitride-based semiconductor layer with a thickness of not more than 3 nm. According to this structure, the first electrode layer can be easily formed on the nitride-based semiconductor layer with islandlike heterogeneous distribution.

In the aforementioned nitride-based semiconductor light-emitting device according to the second aspect, the first electrode layer is preferably formed by patterning. According to this structure, the first electrode layer can be partially formed on a prescribed region of the nitride-based semiconductor layer.

In the aforementioned nitride-based semiconductor light-emitting device according to the second aspect, the nitride-based semiconductor layer preferably has an irregular surface. According to this structure, the contact areas between the nitride-based semiconductor layer and the first and second electrode layers can be so increased that the contact area between the nitride-based semiconductor layer and the second electrode layer can be inhibited from reduction resulting from formation of the second electrode layer on the nitride-based semiconductor layer through the first electrode layer. Thus, contact resistance can be stably reduced. In this case, the nitride-based semiconductor layer having the irregular surface preferably has an In composition of at least 3% and a thickness of not more than 20 nm. When the nitride-based semiconductor layer is formed with such a composition and such a thickness, the surface of the nitride-based semiconductor layer can be easily irregularized.

In the aforementioned nitride-based semiconductor light-emitting device according to the second aspect, the nitride-based semiconductor layer preferably includes a contact layer formed on a projection portion of a cladding layer, and the projection portion of the cladding layer and the contact layer preferably form a ridge portion. While an electrode must be formed on the contact layer having a narrow area in this structure, the first electrode layer can increase adhesion of the overall electrode layer to the contact layer forming the ridge portion and the second electrode layer can attain low contact resistance. Consequently, operating current and operating voltage can be reduced, whereby the device can be improved in reliability.

A method of forming a nitride-based semiconductor light-emitting device according to a third aspect of the present invention comprises steps of forming a nitride-based semiconductor layer on an active layer, partially forming a first electrode layer containing a material having strong adhesion to the nitride-based semiconductor layer on the surface of the nitride-based semiconductor layer, and forming a second electrode having weaker adhesion to the nitride-based semiconductor layer than the first electrode layer and containing a material having lower contact resistance to the nitride-based semiconductor layer than the first electrode layer on the first electrode layer to have a portion coming into contact with the surface of the nitride-based semiconductor layer.

In the method of forming a nitride-based semiconductor light-emitting device according to the third aspect, the first electrode layer containing the material having strong adhesion to the nitride-based semiconductor layer is partially formed on the surface of the nitride-based semiconductor layer and the second electrode layer containing the material having low contact resistance to the nitride-based semiconductor layer is formed on the first electrode layer to have the portion coming into contact with the surface of the nitride-based semiconductor layer as hereinabove described, whereby the first electrode layer can increase adhesion of the overall electrode layer to the nitride-based semiconductor layer and the second electrode layer can attain low contact resistance. Thus, reliability of the device can be improved and the nitride-based semiconductor light-emitting device can be easily formed to be capable of reducing operating voltage.

In the method of forming a nitride-based semiconductor light-emitting device according to the third aspect, the step of partially forming the first electrode layer on the surface of the nitride-based semiconductor layer preferably includes a step of forming the first electrode layer on the surface of the nitride-based semiconductor layer with a small thickness partially forming an opening. According to this structure, the first electrode layer can be easily partially formed on the surface of the nitride-based semiconductor layer.

In the method of forming a nitride-based semiconductor light-emitting device according to the third aspect, the step of partially forming the first electrode layer on the surface of the nitride-based semiconductor layer preferably includes a step of forming the first electrode layer and the second electrode layer on the surface of the nitride-based semiconductor layer and thereafter feeding current between the second electrode layer and the nitride-based semiconductor layer thereby moving part of the second electrode layer to come into contact with the surface of the nitride-based semiconductor layer. According to this structure, the second electrode layer can reliably exhibit a low contact property without damaging adhesion of the first electrode layer to the nitride-based semiconductor layer.

In the aforementioned method of forming a nitride-based semiconductor light-emitting device according to the third aspect, the step of partially forming the first electrode layer on the surface of the nitride-based semiconductor layer preferably includes steps of forming a resist pattern on the surface of the nitride-based semiconductor layer, and forming the first electrode layer on the resist pattern and thereafter removing the resist pattern thereby patterning the first electrode layer. When a lift off method is employed in this manner, the first electrode layer can be easily partially formed on the surface of the nitride-based semiconductor layer. Thus, the second electrode layer can reliably come into contact with the nitride-based semiconductor layer on a region of the nitride-based semiconductor layer formed with no first electrode layer.

In the aforementioned method of forming a nitride-based semiconductor light-emitting device according to the third aspect, the step of partially forming the first electrode layer on the surface of the nitride-based semiconductor layer preferably includes steps of forming the first electrode layer on the surface of the nitride-based semiconductor layer and thereafter forming a resist pattern on the first electrode layer, and etching the first electrode layer through the resist pattern serving as a mask thereby patterning the first electrode layer. According to this structure, the first electrode layer can be more reliably partially formed on the surface of the nitride-based semiconductor layer. Thus, the second electrode layer can reliably come into contact with the nitride-based semiconductor layer on a region of the nitride-based semiconductor layer formed with no first electrode layer.

In the aforementioned method of forming a nitride-based semiconductor light-emitting device patterning the first electrode layer, the step of forming the first electrode layer preferably includes a step of forming the first electrode layer in a lattice shape in plan view by patterning the first electrode layer. According to this structure, the first electrode layer can be partially formed on the surface of the nitride-based semiconductor layer with homogeneous distribution, whereby the first electrode layer can homogeneously increase adhesion of the overall electrode layer to the nitride-based semiconductor layer in the in-plane direction of the nitride-based semiconductor layer. When the first electrode layer is formed in the lattice shape, the second electrode layer can reliably come into contact with the nitride-based semiconductor layer on the region of the nitride-based semiconductor layer formed with no first electrode layer.

In the aforementioned method of forming a nitride-based semiconductor light-emitting device according to the third aspect, the step of forming the first electrode layer preferably includes a step of forming the first electrode layer by any of electron beam heating evaporation, resistance heating evaporation and sputter deposition. When employing such a method, the first electrode layer containing the material having strong adhesion to the nitride-based semiconductor layer can be easily formed. Further, the first electrode layer can be easily formed on the nitride-based semiconductor layer with islandlike heterogeneous distribution.

In the aforementioned method of forming a nitride-based semiconductor light-emitting device according to the third aspect, the step of forming the second electrode layer preferably includes a step of forming the second electrode layer on the first electrode layer and thereafter performing heat treatment. According to this structure, contact resistance of the second electrode layer can be further reduced.

In the aforementioned method of forming a nitride-based semiconductor light-emitting device according to the third aspect, the nitride-based semiconductor layer preferably includes a contact layer formed on a cladding layer, and the step of forming the second electrode layer preferably includes a step of forming the second electrode layer on a prescribed region of the upper surface of the first electrode layer by a lift off method, while the method preferably further comprises a step of forming the second electrode layer and thereafter partially etching the first electrode layer, the contact layer and the cladding layer through the second electrode layer serving as a mask thereby forming a ridge portion. According to this structure, the ridge portion consisting of a projecting portion of the cladding layer and the contact layer can be easily formed. When the first electrode layer is patterned not by the lift off method but by etching, pattern peeling easily caused in the lift off method can be prevented.

In the aforementioned method of forming a nitride-based semiconductor light-emitting device according to the third aspect, the first electrode layer preferably contains at least one material selected from a group consisting of Pt, Ni, Cr, Ti, Hf and Zr, and the second electrode layer preferably contains Pd. According to this structure, the first electrode layer can easily increase adhesion of the overall electrode layer to the nitride-based semiconductor layer, and the second electrode layer can attain low contact resistance.

In the aforementioned method of forming a nitride-based semiconductor light-emitting device according to the third aspect, the step of forming the nitride-based semiconductor layer preferably includes a step of forming the nitride-based semiconductor layer having an irregular surface. According to this structure, the contact areas between the nitride-based semiconductor layer and the first and second electrode layers can be so increased that the contact area between the nitride-based semiconductor layer and the second electrode layer can be inhibited from reduction resulting from formation of the second electrode layer on the nitride-based semiconductor layer through the first electrode layer. Thus, contact resistance can be stably reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
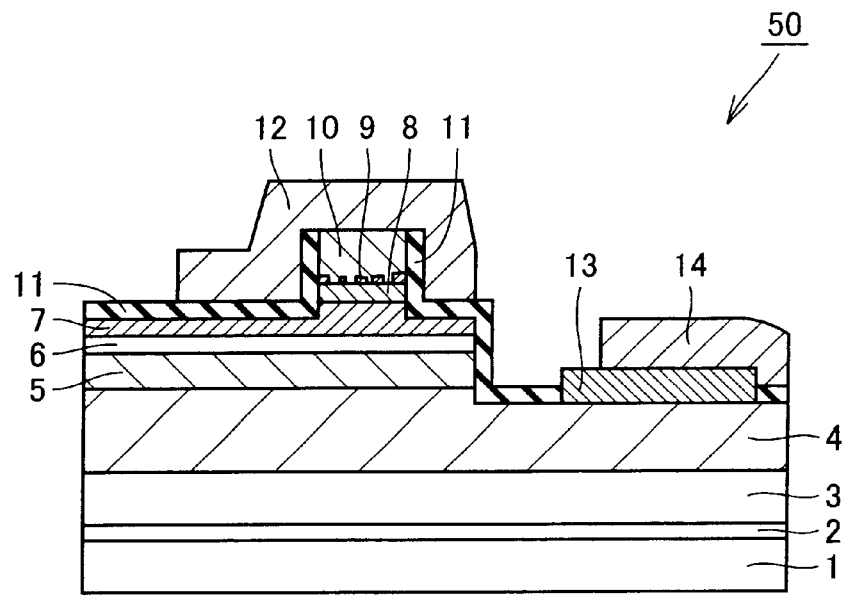
FIG. 1 is a sectional view showing a nitride-based semiconductor laser element according to a first embodiment of the present invention.

Embodiments of the present invention are now described with reference to the drawings.

First Embodiment

The structure of a nitride-based semiconductor layer element 50 according to a first embodiment of the present invention is described with reference to FIGS. 1 and 2. According to the first embodiment, an AlGaN low-temperature buffer layer 2 having a thickness of about 15 nm is formed on a sapphire substrate 1. An undoped GaN layer 3 having a thickness of about 3 $\mu$m is formed on the AlGaN low-temperature buffer layer 2. An n-type GaN contact layer 4 having a thickness of about 5 $\mu$m, an n-type AlGaN cladding layer 5 having a thickness of about 1 $\mu$m, an MQW emission layer 6 having a thickness of about 50 nm and a p-type AlGaN cladding layer 7 having a thickness of about 300 nm with a projection portion are successively formed on the undoped GaN layer 3. The MQW emission layer 6 is an example of the "active layer" according to the present invention, and the p-type GaN contact layer 8 is an example of the "nitride-based semiconductor layer" according to the present invention.

According to the first embodiment, a Pt electrode layer 9 having a thickness of about 1 nm is formed on the p-type GaN layer 8 to partially have openings. A Pd-based electrode layer 10 consisting of a three-layer structure including a Pd layer of about 20 nm in thickness, an Au layer of about 100 nm in thickness and an Ni layer of about 200 nm in thickness in ascending order is formed on the Pt electrode layer 9. The lowermost Pd layer of the Pd-based electrode layer 10 is formed to come into contact with the p-type GaN contact layer 8 through the openings of the Pt electrode layer 9. The Pt electrode layer 9 and the Pd-based electrode layer 10 form a p-side electrode. The Pt electrode layer 9 is an example of the "first electrode layer" according to the present invention, and the Pd-based electrode layer 10 is an example of the "second electrode layer" according to the present invention.

An $SiO_2$ film 11 is formed to cover the upper surface of the Pd-based electrode layer 10 and regions other than part of the upper surface of the n-type GaN contact layer 4. A pad electrode 12 is formed to be in contact with the upper surface of the Pd-based electrode layer 10. An n-side electrode 13 is formed on the upper surface of the n-type GaN contact layer 4. A pad electrode 14 is formed to be in contact with the n-side electrode 13.

According to the first embodiment, the Pt electrode layer 9 of Pt having strong adhesion to the p-type GaN contact layer 8 is partially formed on the p-type GaN contact layer 8 and the Pd-based electrode layer 10 containing Pd having low contact resistance (interfacial energy barrier) to the p-type GaN contact layer 8 is formed on the Pt electrode layer 9 to be in contact with the p-type GaN contact layer 8 as hereinabove described, whereby the Pt electrode layer 9 can increase adhesion of the p-side electrode to the p-type GaN contact layer 8 and the Pd layer of the Pd-based electrode layer 10 can attain low contact resistance. Thus, reliability of the element 50 can be improved and operating voltage can be reduced.

Figure 3:
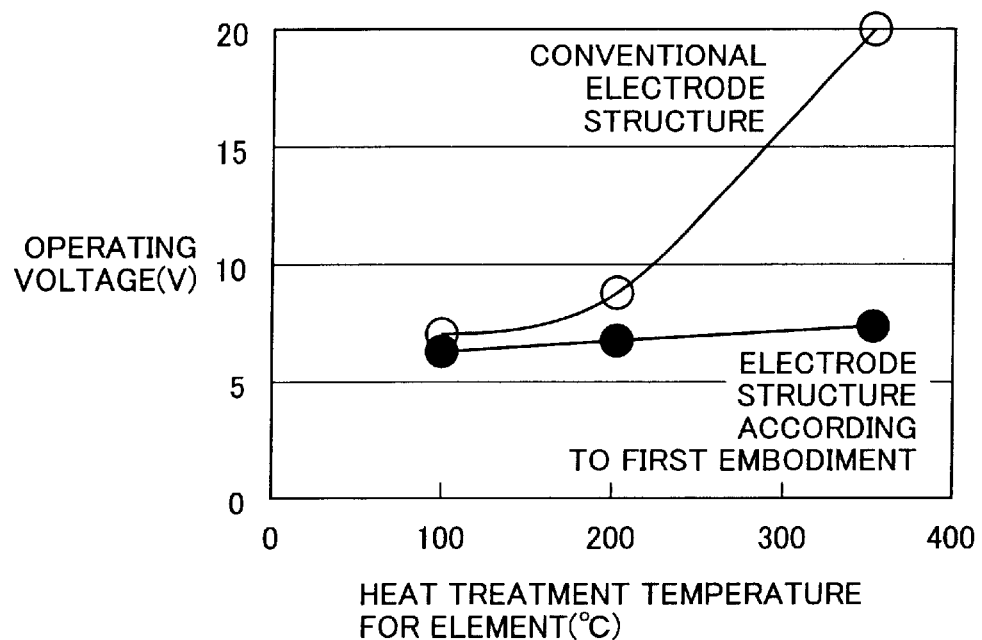
FIG. 3 is a characteristic diagram for illustrating an effect of the nitride-based semiconductor laser element according to the first embodiment shown in FIG. 1.

FIG. 3 shows changes of operating voltage after heat treatment of the nitride-based semiconductor laser element 50 according to this embodiment and a conventional semiconductor laser element. In order to fix a nitride-based semiconductor laser chip on a package and wire the same by soldering, it is necessary to heat the chip to about 350° C. When the conventional laser element including a Pd-based electrode consisting of a Pd layer of 10 nm, an Au layer of 100 nm and an Ni layer of 200 nm is subjected to heat treatment of 350° C. after preparation of the element, the operating voltage is increased from 7 V to 20 V due to deterioration of the ohmic property of the electrode, as shown in FIG. 3. On the other hand, the nitride-based semiconductor layer element 50 according to the first embodiment including the Pt electrode layer 9 and the Pd-based electrode layer 10 can maintain an excellent ohmic property also after heat treatment of 350° C., and the operating voltage is hardly increased as a result, as shown in FIG. 3. Therefore, low operating voltage can be attained in the first embodiment.

A process of fabricating the nitride-based semiconductor laser element 50 according to the first embodiment is now described with reference to FIGS. 1, 2 and 4 to 9.

Figure 4:
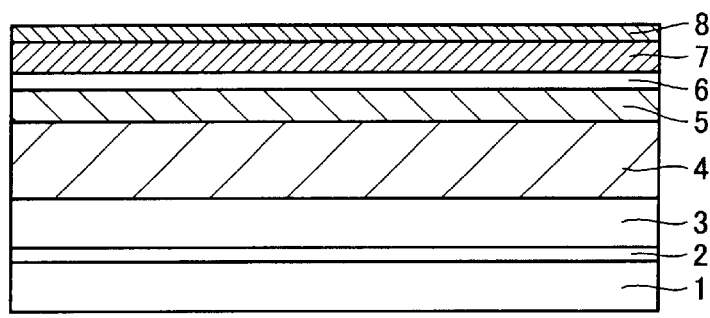
FIGS. 4 to 8 are sectional views for illustrating a process of fabricating the nitride-based semiconductor laser element according to the first embodiment shown in FIG. 1.

As shown in FIG. 4, the AlGaN low-temperature buffer layer 2 having the thickness of about 15 nm is formed on the sapphire substrate 1 by MOCVD under a low temperature condition of about 600° C. for relaxing lattice mismatching. Thereafter the undoped GaN layer 3 is formed on the AlGaN low-temperature buffer layer 2 with the thickness of about 3 $\mu$m by MOCVD.

Figure 5:
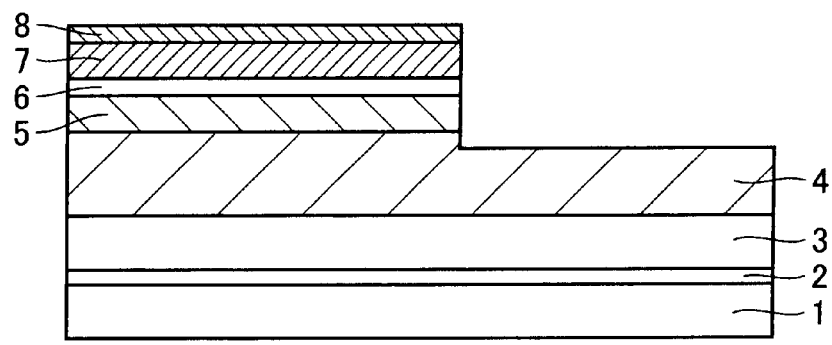

Thereafter the n-type GaN contact layer 4 having the thickness of about 5 μm, the n-type AlGaN cladding layer 5 having the thickness of about 1 μm, the MQW emission layer 6 having the thickness of about 50 nm, the p-type AlGaN cladding layer 7 having the thickness of about 300 nm and the p-type GaN contact layer 8 having the thickness of about 70 nm are successively formed on the undoped GaN layer 3 by MOCVD. Partial regions of the layers from the p-type GaN contact layer 8 to the n-type GaN contact layer 4 are etched by anisotropic dry etching, thereby exposing a partial region of the n-type GaN contact layer 4 as shown in FIG. 5.

Figure 6:
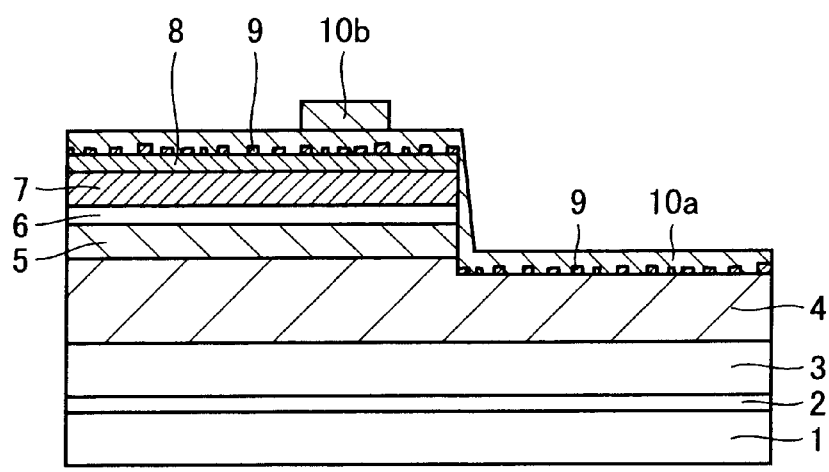

After cleaning by boiling with aqua regia, the Pt electrode layer 9 is formed by EB evaporation with the thickness of about 1 nm and a Pd layer 10a is formed on the Pt electrode layer 9 with a thickness of about 10 nm, as shown in FIG. 6. A very thin film formed by EB evaporation has a relatively heterogeneous thickness, and hence the Pt electrode layer 9 having the small thickness of about 1 nm is formed on the upper surfaces of the p-type GaN contact layer 8 and the n-type GaN contact layer 4 with a heterogeneous thickness to partially have openings. The Pd layer 10a is formed on the Pt electrode layer 9 to come into contact with the upper surface of the p-type GaN contact layer 8 through the openings of the Pt electrode layer 9. Thereafter a multilayer film consisting of a Pd layer of about 10 nm in thickness, an Au layer of about 100 nm in thickness and an Ni layer of about 200 nm in thickness is formed on a region of the Pd layer 10a corresponding to the ridge portion in a striped shape (elongated shape) about 2 μm in width.

Figure 7:
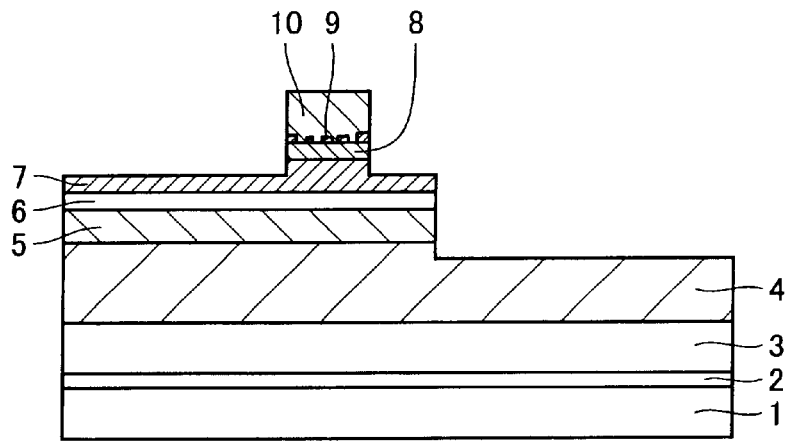

The uppermost Ni layer of the multilayer film 10b is employed as an etching mask for etching the Pd layer 10a, the Pt electrode layer 9 and the p-type GaN contact layer 8 by anisotropic etching employing $CF_4$ gas and thereafter etching the p-type AlGaN cladding layer 7 by a thickness of about 150 nm. Thus, the ridge portion is formed as shown in FIG. 7, along with formation of the Pt electrode layer 9 and the Pd-based electrode layer 10 having the Pd layer of about 20 nm, the Au layer of about 100 nm and the Ni layer of about 200 nm successively stacked in ascending order. The Pt electrode layer 9 and the Pd-based electrode layer 10 form the p-side electrode in the first embodiment.

Figure 8:
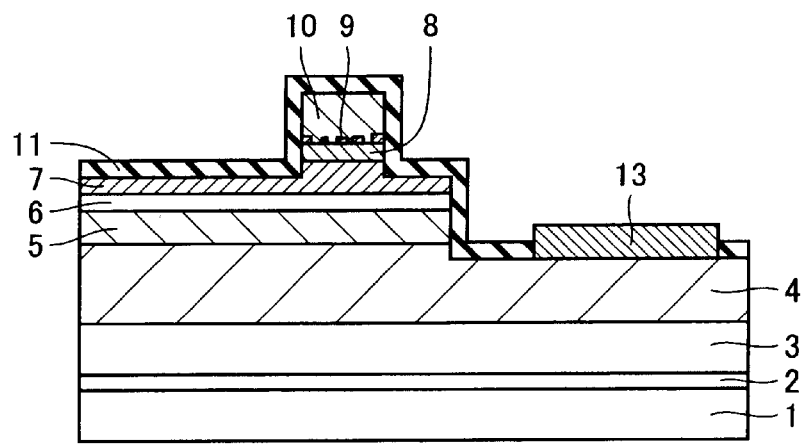

As shown in FIG. 8, the $SiO_2$ film 11 is deposited by plasma CVD, and thereafter partially removed from part of the n-type GaN contact layer 4. The n-side electrode 13 is formed on the part of the n-type GaN contact layer 4 from which the $SiO_2$ film 11 is partially removed.

Finally, the $SiO_2$ film 11 is partially removed from the upper surface of the Pd-based electrode layer 10, followed by formation of the pad electrodes 12 and 14 to be in contact with the Pd-based electrode layer 10 and the n-side electrode 13 respectively. Thus, the nitride-based semiconductor laser element 50 according to the first embodiment is formed.

In the fabrication process according to the first embodiment, as hereinabove described, the Pt electrode layer 9 having strong adhesion is partially present between the Pd-based electrode layer 10 containing Pd, i.e., a low contact material (low interfacial energy barrier material), and the p-type GaN contact layer 8, whereby the Pd-based electrode 10 and the p-type GaN contact layer 8 partially come into contact with each other. Therefore, the Pd-based electrode layer 10 can reduce a voltage drop in the electrode part while the Pt electrode layer 9 can prevent peeling. Consequently, the nitride-based semiconductor laser element 50 can be formed with low operating voltage and high reliability. Contact resistance of Pt is more easily influenced by the surface state of a semiconductor than Pd and unstable. According to the first embodiment, a multilayer structure of Pt and Pd is employed for keeping a low contact property of Pd undamaged while instability of Pt itself is improved due to the presence of Pd, whereby contact resistance can be synergistically reduced.

In the fabrication process according to the first embodiment, further, the Pt electrode layer 9 and the Pd layer 10a are patterned not by a lift off method but by a method of depositing the same on the overall surface and etching the same, whereby pattern peeling easily caused in the lift off method can be suppressed.

When cleaning is performed with strong acid such as hydrochloric acid or aqua regia immediately before evaporating the electrode material (the Pt electrode layer 9) in the aforementioned fabrication process according to the first embodiment, contact resistance can be further reduced.

Figure 2:
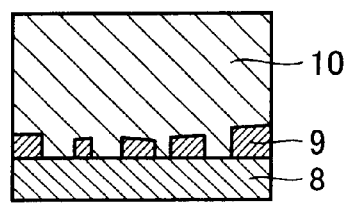
FIG. 2 is an enlarged sectional view of a portion of the nitride-based semiconductor laser element according to the first embodiment shown in FIG. 1 around a p-side electrode.
Figure 9:
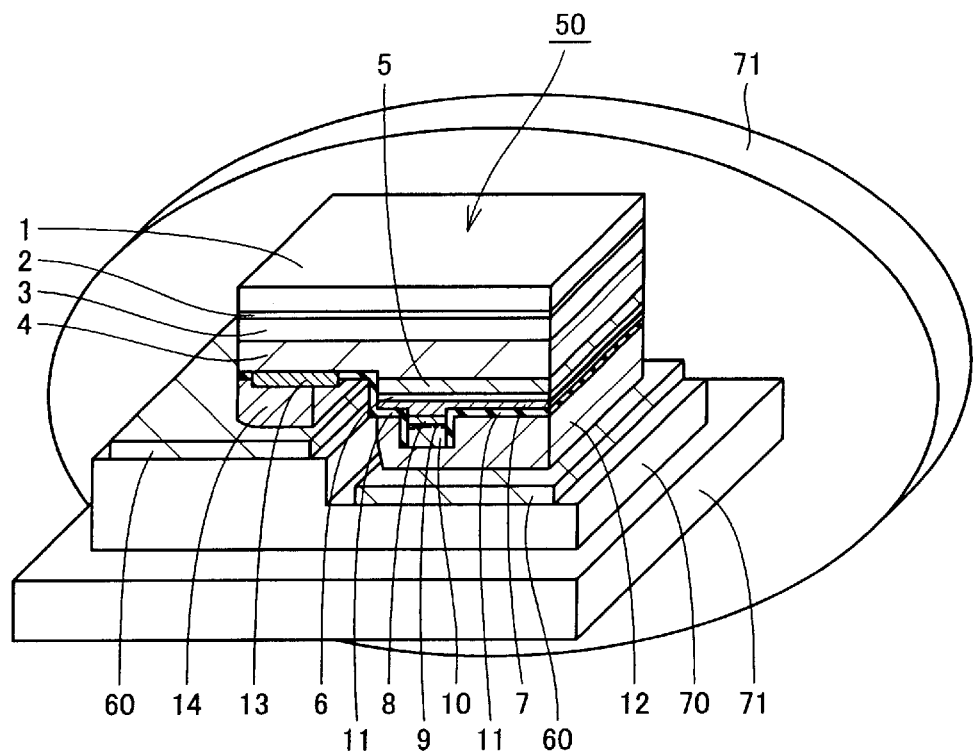
FIG. 9 is a perspective view showing the nitride-based semiconductor laser element according to the first embodiment shown in FIG. 1 in a state mounted on a submount in a junction-down system.

FIG. 9 shows the nitride-based semiconductor laser element 50 according to the first embodiment shown in FIG. 1 in a state mounted on a submount 70 provided on a stem 71 from the side of the ridge portion in a junction-down system. The nitride-based semiconductor laser element 50 according to the first embodiment is mounted on the submount 70 for heat radiation in the junction-down system with a fusing material 60 such as solder. When the junction-down system is employed, an exothermic region of the MQW emission layer 6 further approaches the submount 70 as compared with a junction-up system without through the sapphire substrate 1 inferior in thermal conductivity, whereby the element 50 can be improved in heat radiation. Consequently, threshold current can be prevented from increase resulting from deterioration of heat radiation, whereby the operating current and power consumption of the nitride-based semiconductor laser element 50 can be reduced.

According to the first embodiment, the Pt electrode layer 9 can improve adhesion of the p-side electrode, whereby the p-side electrode can be inhibited from deterioration of the ohmic property caused by heat in welding or stress also in the junction-down system. Thus, a device having an excellent heat radiation effect with low power consumption can be implemented.

Second Embodiment

Figure 10:
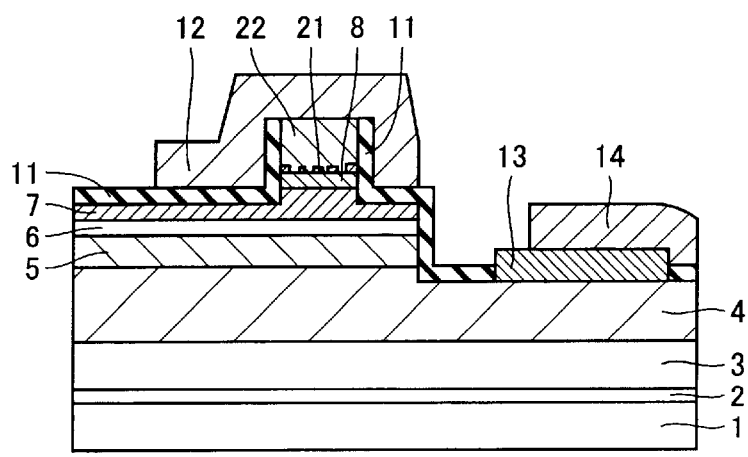
FIG. 10 is a sectional view showing a nitride-based semiconductor laser element according to a second embodiment of the present invention.
Figure 11:
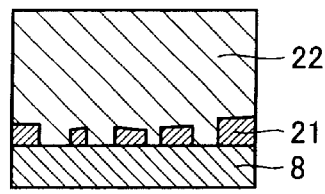
FIG. 11 is an enlarged sectional view of a portion of the nitride-based semiconductor laser element according to the second embodiment shown in FIG. 10 around a p-side electrode.

The structure of a nitride-based semiconductor laser element according to a second embodiment of the present invention is now described with reference to FIGS. 10 and 11. According to the second embodiment, an AlGaN low-temperature buffer layer 2 having a thickness of about 15 nm, an undoped GaN layer 3 having a thickness of about 3 μm, an n-type GaN contact layer 4 having a thickness of about 5 μm, an n-type AlGaN cladding layer 5 having a thickness of about 1 μm, an MQW emission layer 6 having a thickness of about 50 nm, a p-type AlGaN cladding layer 7 having a thickness of about 300 nm and a p-type GaN contact layer 8 having a thickness of about 70 nm are successively formed on a sapphire substrate 1, similarly to the first embodiment.

According to the second embodiment, a Pt electrode layer 21 is formed on the p-type GaN contact layer 8 to partially have openings. A Pd-based electrode layer 22 consisting of a three-layer structure including a Pd layer of about 20 nm in thickness, an Au layer of about 100 nm in thickness and an Ni layer of about 200 nm in thickness in ascending order is formed on the Pt electrode layer 21. The lowermost Pd layer of the Pd-based electrode layer 22 is formed to come into contact with the p-type GaN contact layer 8 through the openings of the Pt electrode layer 21. The Pt electrode layer 21 and the Pd-based electrode layer 22 form a p-side electrode. The Pt electrode layer 21 is an example of the "first electrode layer" according to the present invention, and the Pd-based electrode layer 22 is an example of the "second electrode layer" according to the present invention.

An $SiO_2$ film 11 is formed to cover the upper surface of the Pd-based electrode layer 22 and regions other than an exposed part of the upper surface of the n-type GaN contact layer 4. A pad electrode 12 is formed to be in contact with the upper surface of the Pd-based electrode layer 22. An n-side electrode 13 is formed on the exposed part of the upper surface of the n-type GaN contact layer 4. A pad electrode 14 is formed on the n-side electrode 13.

According to the second embodiment, the Pt electrode layer 21 of Pt having strong adhesion to the p-type GaN contact layer 8 is formed on the p-type GaN contact layer 8 to partially have openings and the Pd-based electrode layer 22 containing Pd having low contact resistance (interfacial energy barrier) to the p-type GaN contact layer 8 is formed on the Pt electrode layer 21 to be in contact with the p-type GaN contact layer 8 similarly to the first embodiment, whereby the Pt electrode layer 21 can increase adhesion of the p-side electrode to the p-type GaN contact layer 8 and the Pd layer of the Pd-based electrode layer 22 can attain low contact resistance. Thus, reliability of the element can be improved and operating voltage can be reduced.

A process of fabricating the nitride-based semiconductor laser element according to the second embodiment is now described with reference to FIGS. 10 to 18.

Figure 12:
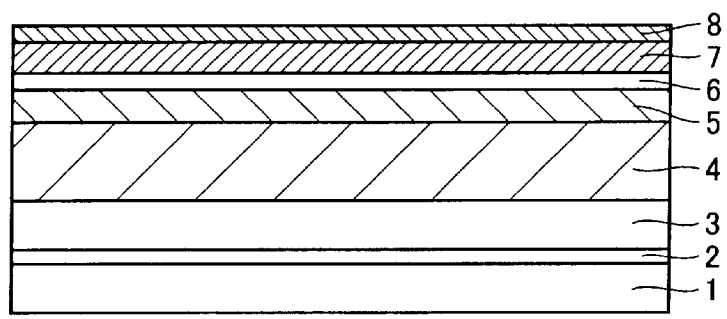
FIGS. 12 to 18 are sectional views for illustrating a process of fabricating the nitride-based semiconductor laser element according to the second embodiment shown in FIG. 10.

As shown in FIG. 12, the AlGaN low-temperature buffer layer 2 having the thickness of about 15 nm is formed on the sapphire substrate 1 by MOCVD under a low temperature condition of about 600° C for relaxing lattice mismatching. Thereafter the undoped GaN layer 3 is formed on the AlGaN low-temperature buffer layer 2 with the thickness of about 3 $\mu$m by MOCVD. Then, the n-type GaN contact layer 4 having the thickness of about 5 $\mu$m, the n-type AlGaN cladding layer 5 having the thickness of about 1 $\mu$m, the MQW emission layer 6 having the thickness of about 50 nm, the p-type AlGaN cladding layer 7 having the thickness of about 300 nm and the p-type GaN contact layer 8 having the thickness of about 70 nm are successively formed on the undoped GaN layer 3 by MOCVD.

Figure 13:
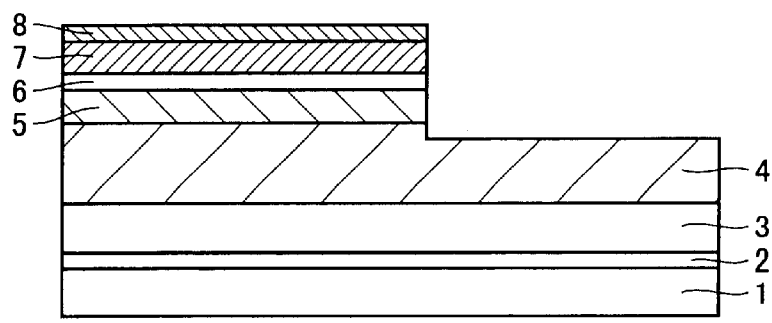

Partial regions of the layers from the p-type GaN contact layer 8 to the n-type GaN contact layer 4 are etched by anisotropic dry etching, thereby exposing a partial region of the n-type GaN contact layer 4 as shown in FIG. 13.

Figure 14:
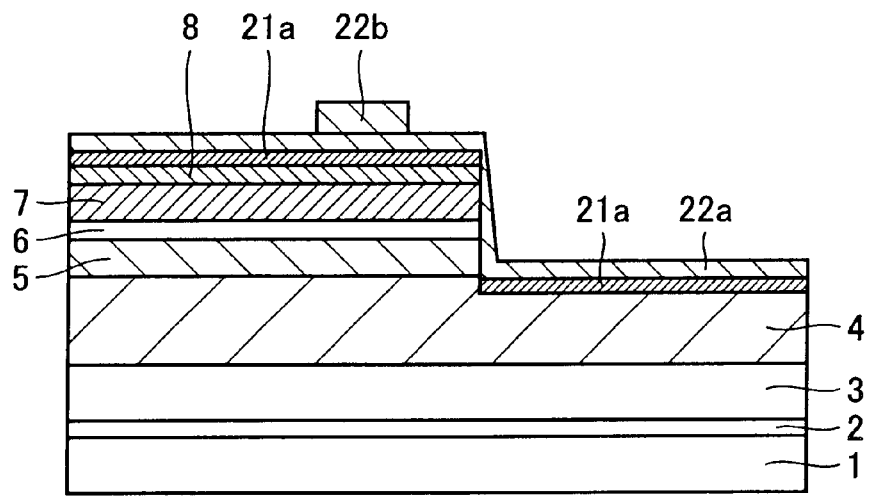

After cleaning by boiling with aqua regia, a Pt electrode layer 21a having a thickness of about 3 nm and a Pd layer 22a having a thickness of about 10 nm are successively formed by EB evaporation, as shown in FIG. 14. In this case, the Pt electrode layer 21a is formed with a larger thickness of about 3 nm as compared with that of about 1 nm in the first embodiment, and hence the surface of the p-type GaN contact layer 8 and substantially the overall surface of the n-type GaN contact layer 4 are covered with the Pt electrode layer 21a having a heterogeneous thickness. A multilayer film 22b consisting of a three-layer structure including a Pd layer of about 10 nm in thickness, an Au layer of about 100 nm in thickness and an Ni layer of about 200 nm in thickness in ascending order is formed on a region of the Pd layer 22a corresponding to that formed with the ridge portion in a striped shape of about 2 $\mu$m in width.

Figure 15:
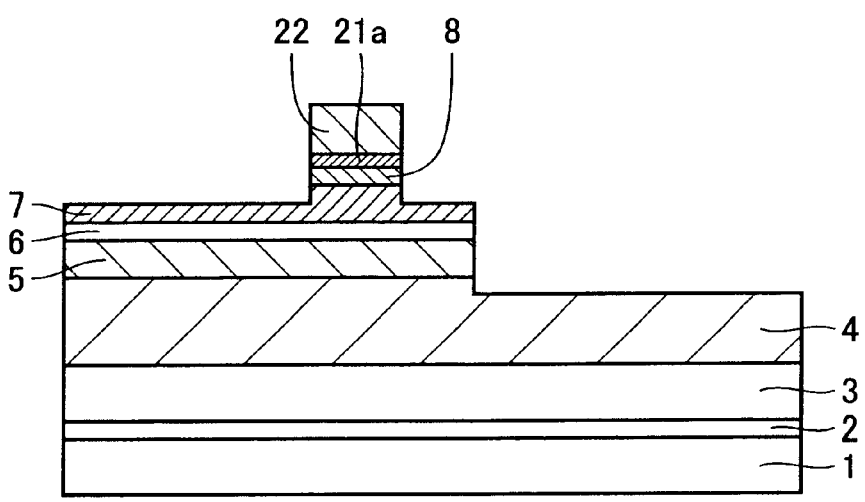

The uppermost Ni layer of the multilayer film 22b is employed as an etching mask for etching the Pd layer 22a, the Pt electrode layer 21a and the p-type GaN contact layer 8 by anisotropic etching employing $CF_4$ gas and thereafter etching the p-type AlGaN cladding layer 7 by a thickness of about 150 nm. Thus, the ridge portion is formed as shown in FIG. 15, along with formation of the Pt electrode layer 21a and the Pd-based electrode layer 22 having the Pd layer of about 20 nm, the Au layer of about 100 nm and the Ni layer of about 200 nm successively stacked in ascending order.

Figure 16:
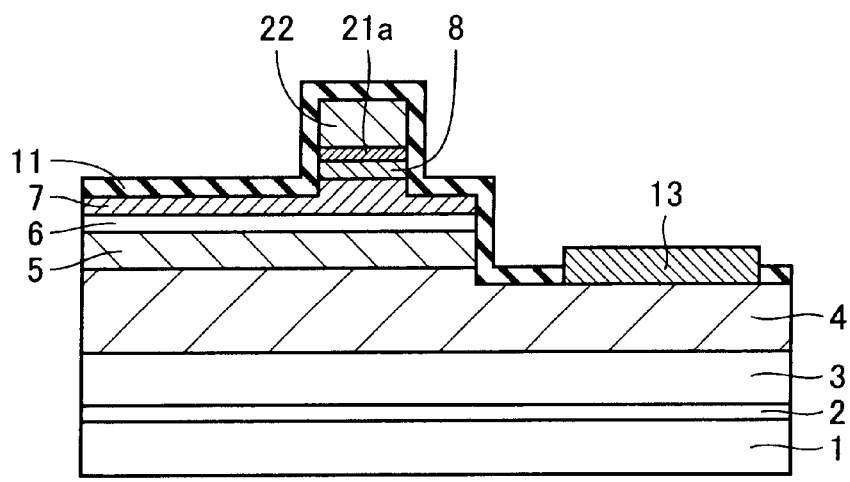

As shown in FIG. 16, the $SiO_2$ film 11 is deposited on the overall surface by plasma CVD, and thereafter partially removed from part of the n-type GaN contact layer 4. The n-side electrode 13 is formed on the part of the n-type GaN contact layer 4 from which the $SiO_2$ film 11 is removed.

Figure 17:
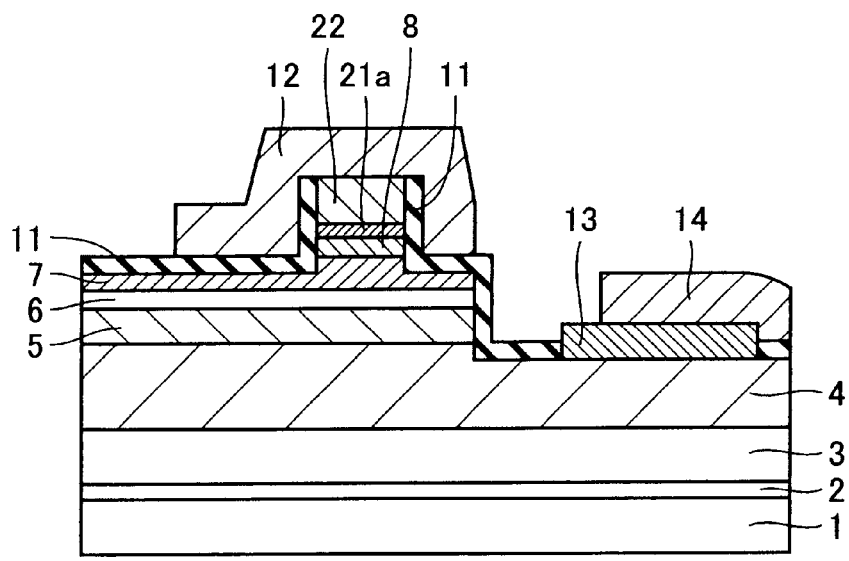

Finally, the $SiO_2$ film 11 is partially removed from the upper surface of the Pd-based electrode layer 22, followed by formation of the pad electrodes 12 and 14 to be in contact with the upper surfaces of the Pd-based electrode layer 22 and the n-side electrode 13 respectively as shown in FIG. 17.

Figure 18:
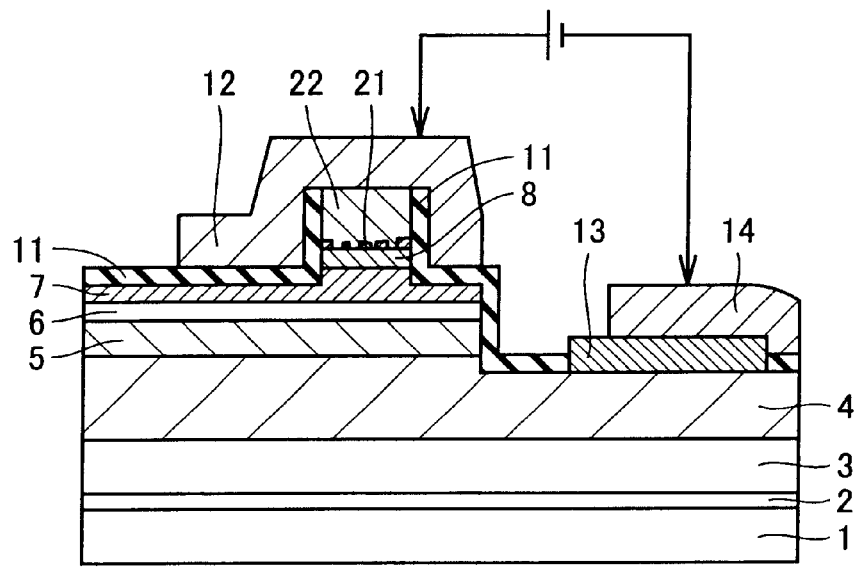

Then, current of about 0.6 A is applied between the p-side pad electrode 12 and the n-side pad electrode 14 as shown in FIG. 18, thereby setting current density on the contact surface between the p-side electrode (the Pt electrode layer 21a) and the p-type GaN contact layer 8 to 30 $kA/cm^2$. This state is held for about 5 seconds. A cavity length is set to 1 mm. In this case, the aforementioned current density of 30 $kA/cm^2$ is obtained as follows:

$$0.6 \ A/(1 \ mm \times 2 \ \mu m(\text{width of the ridge portion})) = 30 \ kA/cm^2 \ \ldots \ (1)$$

The aforementioned current density of 30 $kA/cm^2$ must be greater than current density (about 5 $kA/cm^2$) in operation and not more than allowable current density of 100 $kA/cm^2$. In particular, current density in the range of 20 $kA/cm^2$ to 40 $kA/cm^2$ is effective. In consideration of this point, the current density is set to 30 $kA/cm^2$ in the second embodiment. Following the aforementioned current application, Pd contained in the Pd layer forming the Pd-based electrode layer 22 moves toward the Pt side between the Pt electrode layer 21a and the Pd layer due to a migration effect, to partially reach the surface of the p-type GaN contact layer 8. Therefore, the Pt electrode layer 21a (see FIG. 17) formed to cover substantially the overall surface of a prescribed region of the p-type GaN contact layer 8 is converted to the Pt electrode layer 21 (see FIGS. 11 and 18) having openings partially formed on the prescribed region of the p-type GaN contact layer 8.

According to the second embodiment, the current is applied between the p-side electrode and the n-side electrode so that Pd contained in the Pd-based electrode layer 22 reaches the surface of the p-type GaN contact layer 8, whereby Pd can reliably exhibit the low contact property without damaging adhesion by the Pt electrode layer 21.

Third Embodiment

In a nitride-based semiconductor laser element according to a third embodiment of the present invention, a p-type InGaN contact layer 31 is provided between a p-type GaN contact layer 8 and a Pt electrode layer 32.

In the nitride-based semiconductor laser element according to the third embodiment, an AlGaN low-temperature buffer layer 2 having a thickness of about 15 nm, an undoped GaN layer 3 having a thickness of about 3 $\mu$m, an n-type GaN contact layer 4 having a thickness of about 5 $\mu$m, an n-type AlGaN cladding layer 5 having a thickness of about 1 $\mu$m, an MQW emission layer 6 having a thickness of about 50 nm, a p-type AlGaN cladding layer 7 having a thickness of about 300 nm and the p-type GaN contact layer 8 having a thickness of about 70 nm are successively formed on a sapphire substrate 1, similarly to the first embodiment.

Figure 20:
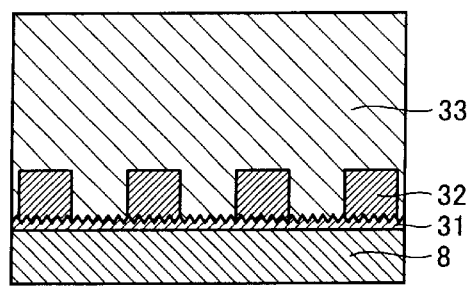
FIG. 20 is an enlarged sectional view of a portion of the nitride-based semiconductor laser element according to the third embodiment shown in FIG. 19 around a p-side electrode.

According to the third embodiment, the p-type InGaN contact layer 31 having a thickness of about 3 nm is formed on the p-type GaN contact layer 8 forming a ridge portion, as shown in FIG. 20. The In composition of the p-type InGaN contact layer 31 is 15%. The surface of such an InGaN contact layer 31 having a small thickness and a high In composition is remarkably irregularized as shown in FIG. 20. The Pt electrode layer 32 having a thickness of about 10 nm, patterned in a lattice shape (see FIG. 21) in plan view, is formed on the p-type InGaN contact layer 31. A Pd-based electrode layer 33 consisting of a multilayer film including a Pd layer of about 10 nm in thickness, an Au layer of about 100 nm in thickness and an Ni layer of about 200 nm in thickness in ascending order is formed on the Pt electrode layer 32. The Pt electrode layer 32 and the Pd-based electrode layer 33 form a p-side electrode. The Pt electrode layer 32 is an example of the "first electrode layer" according to the present invention, and the Pd-based electrode layer 33 is an example of the "second electrode layer" according to the present invention.

An SiO$_2$ film 11 is formed to cover the upper surface of the Pd-based electrode layer 33 and regions other than part of the upper surface of the n-type GaN contact layer 4. A pad electrode 12 is formed to be in contact with the Pd-based electrode layer 33. An n-side electrode 13 is formed to be in contact with the exposed part of the upper surface of the n-type GaN contact layer 4. A pad electrode 14 is formed to be in contact with the upper surface of the n-side electrode 13.

According to the third embodiment, as hereinabove described, the p-type InGaN contact layer 31 having the small thickness of 3 nm and the high In composition of 15% is formed on the p-type GaN contact layer 8, whereby the irregularities of the surface of the p-type InGaN contact layer 31 can be increased. Thus, the contact areas between the p-type InGaN contact layer 31 and the Pt electrode layer 32 and the Pd-based electrode layer 33 can be increased, thereby inhibiting the contact area between the p-type GaN contact layer 8 and the Pd-based electrode layer 33 from reduction as compared with a case of forming the Pd-based electrode layer 33 on the p-type GaN contact layer 8 through the Pt electrode layer 32. Consequently, contact resistance can be stably reduced while adhesion between the Pt electrode layer 32 and the p-type InGaN contact layer 31 can be further improved as compared with the case of forming the Pd-based electrode layer 33 on the p-type GaN contact layer 8 through the Pt electrode layer 32.

Also in the third embodiment, the Pt electrode layer 32 having strong adhesion is provided while the Pd-based electrode layer 33 including the Pd layer having low contact resistance (interfacial energy barrier) on the Pt electrode layer 32 similarly to the first and second embodiments, whereby the Pt electrode layer 32 can increase adhesion of the overall p-side electrode and the Pd layer forming the Pd-based electrode layer 33 can attain low contact resistance.

A process of fabricating the nitride-based semiconductor laser element according to the third embodiment is now described with reference to FIGS. 19 to 26.

Figure 22:
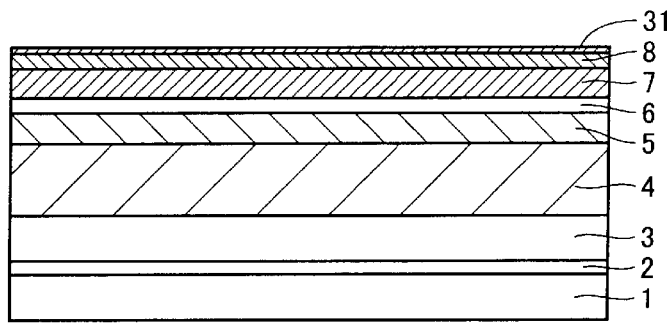
FIGS. 22 to 26 are sectional views for illustrating a process of fabricating the nitride-based semiconductor laser element according to the third embodiment shown in FIG. 19.

As shown in FIG. 22, the AlGaN low-temperature buffer layer 2 having the thickness of about 15 nm is formed on the sapphire substrate 1 by MOCVD under a low temperature condition of about 600° C. for relaxing lattice mismatching. Thereafter the undoped GaN layer 3 having the thickness of about 3 µm is formed on the AlGaN low-temperature buffer layer 2 by MOCVD. Then, the n-type GaN contact layer 4 having the thickness of about 5 µm, the n-type AlGaN cladding layer 5 having the thickness of about 1 µm, the MQW emission layer 6 having the thickness of about 50 nm, the p-type AlGaN cladding layer 7 having the thickness of about 300 nm and the p-type GaN contact layer 8 having the thickness of about 70 nm are successively formed on the undoped GaN layer 3 by MOCVD. Further, the p-type InGaN contact layer 31 having the thickness of about 3 nm with the In composition of 15% is formed on the p-type GaN contact layer 8 by MOCVD.

Figure 23:
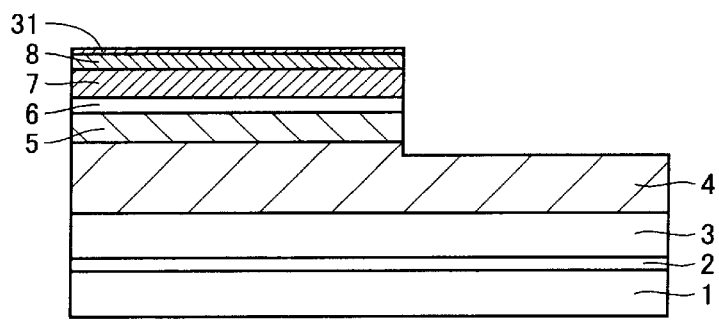

Partial regions of the layers from the p-type InGaN contact layer 31 to the n-type GaN contact layer 4 are etched by anisotropic dry etching, thereby exposing a partial region of the n-type GaN contact layer 4 as shown in FIG. 23.

Figure 21:
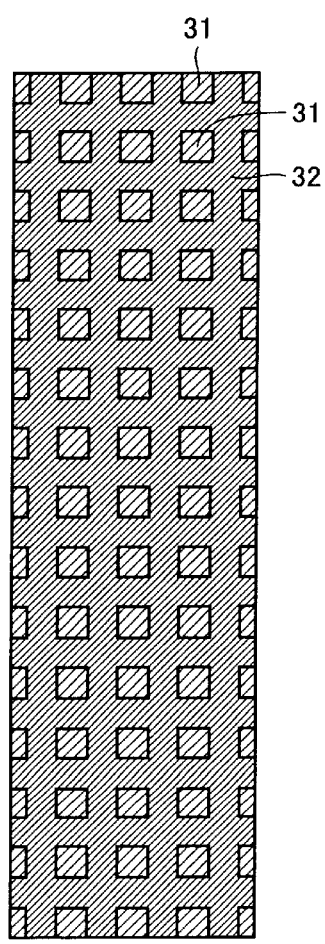
FIG. 21 is a plan view for illustrating the structure of a Pt electrode layer of the nitride-based semiconductor laser element according to the third embodiment shown in FIG. 19.
Figure 24:
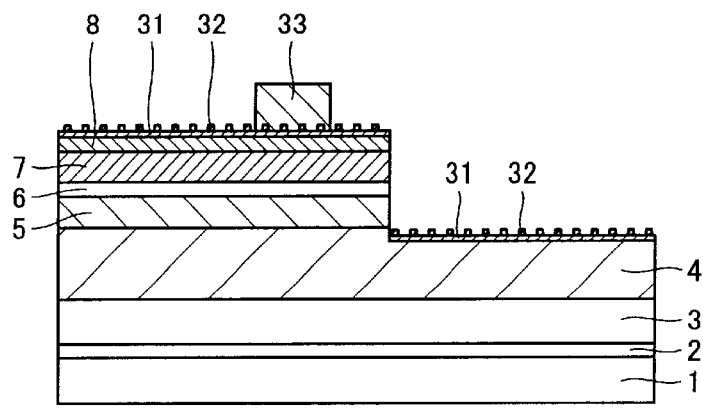
Figure 25:
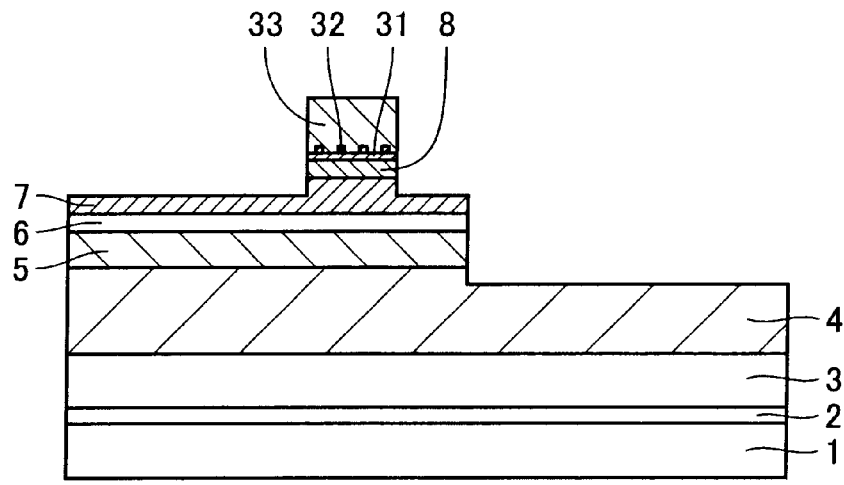

Then, a resist pattern (not shown) is formed in the form of a lattice of about 0.5 µm by about 0.5 µm, and a Pt film (not shown) is formed on the p-type InGaN contact layer 31 and the resist pattern (not shown) with a thickness of about 10 nm by EB evaporation. Thereafter the resist pattern (not shown) is removed, thereby forming the Pt electrode layer 32 patterned in the lattice shape, as shown in FIG. 24 (FIG. 21). Thereafter the Pd-based electrode layer 33 having the three-layer structure including the Pd layer of about 10 nm in thickness, the Au layer of about 100 nm in thickness and the Ni layer of about 200 nm in thickness in ascending order is formed on a region of the Pt electrode layer 32 corresponding to that formed with the ridge portion in a striped shape of about 2 µm in width. Thereafter the temperature is increased to about 400° C. in a nitrogen atmosphere, thereby performing heat treatment.

Figure 27:
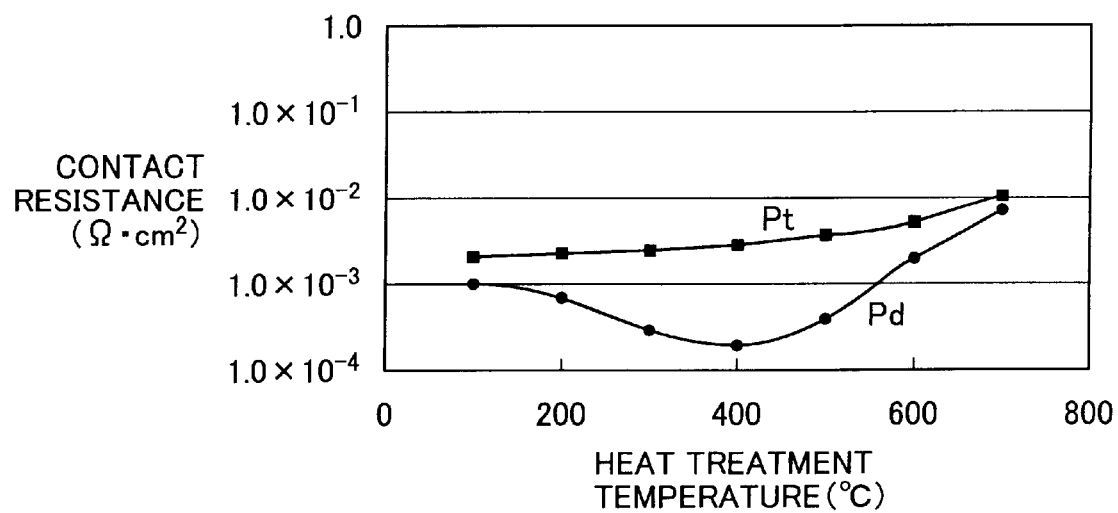
FIG. 27 is a characteristic diagram for illustrating an effect of the nitride-based semiconductor laser element according to the third embodiment shown in FIG. 19.
Figure 28:
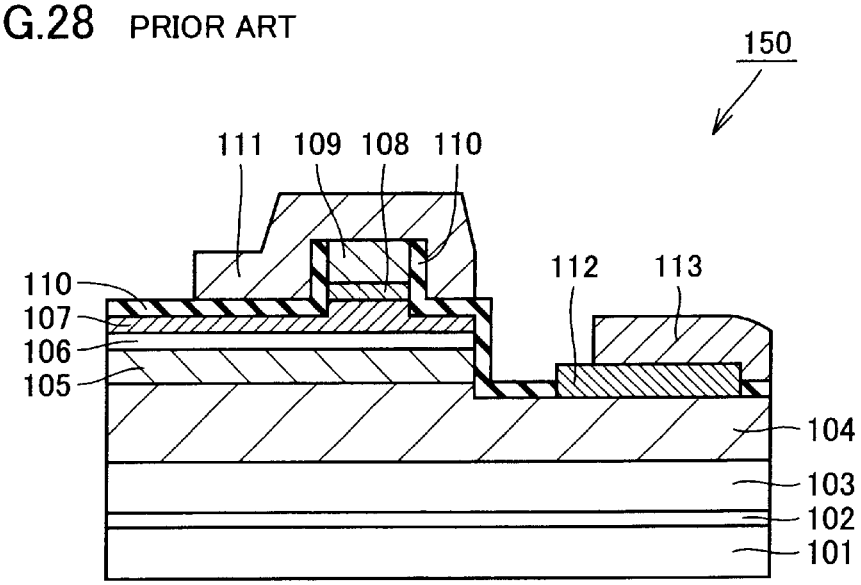
FIG. 28 is a sectional view showing a conventional nitride-based semiconductor laser element.
Figure 29:
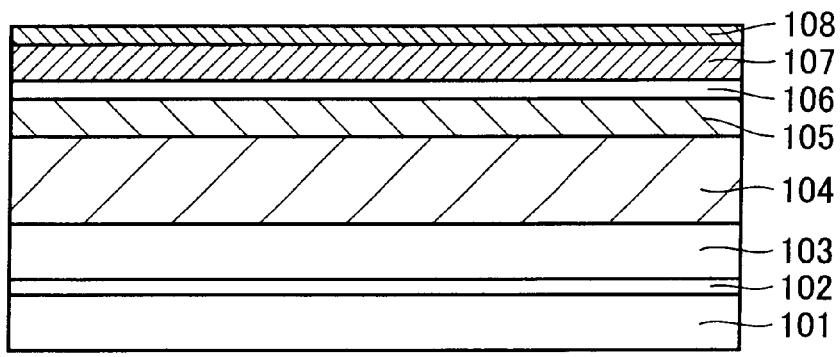
FIGS. 29 to 33 are sectional views for illustrating a process of fabricating the conventional nitride-based semiconductor laser element shown in FIG. 28.
Figure 30:
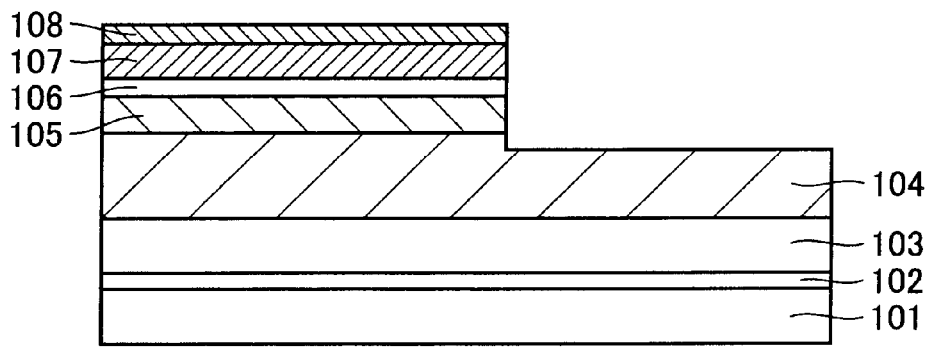
Figure 31:
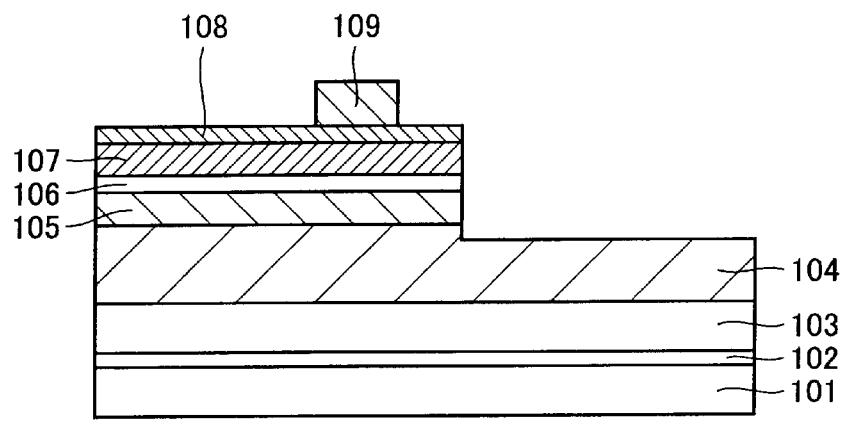
Figure 32:
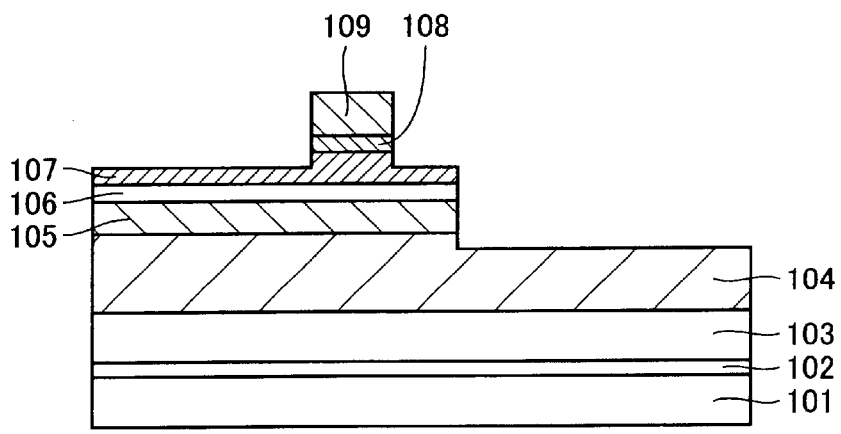
Figure 33:
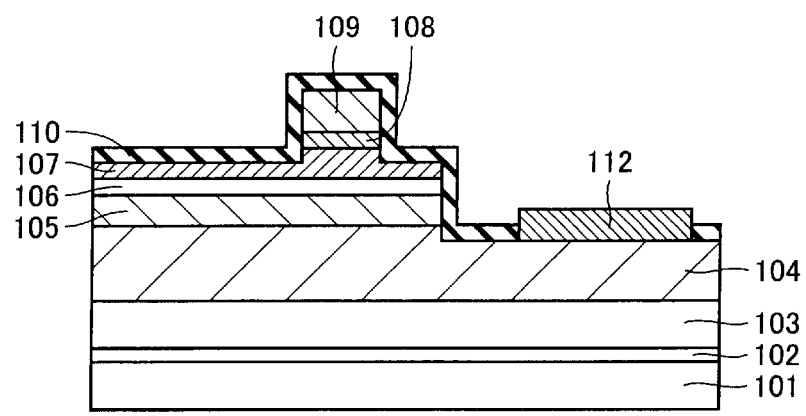
Figure 34:
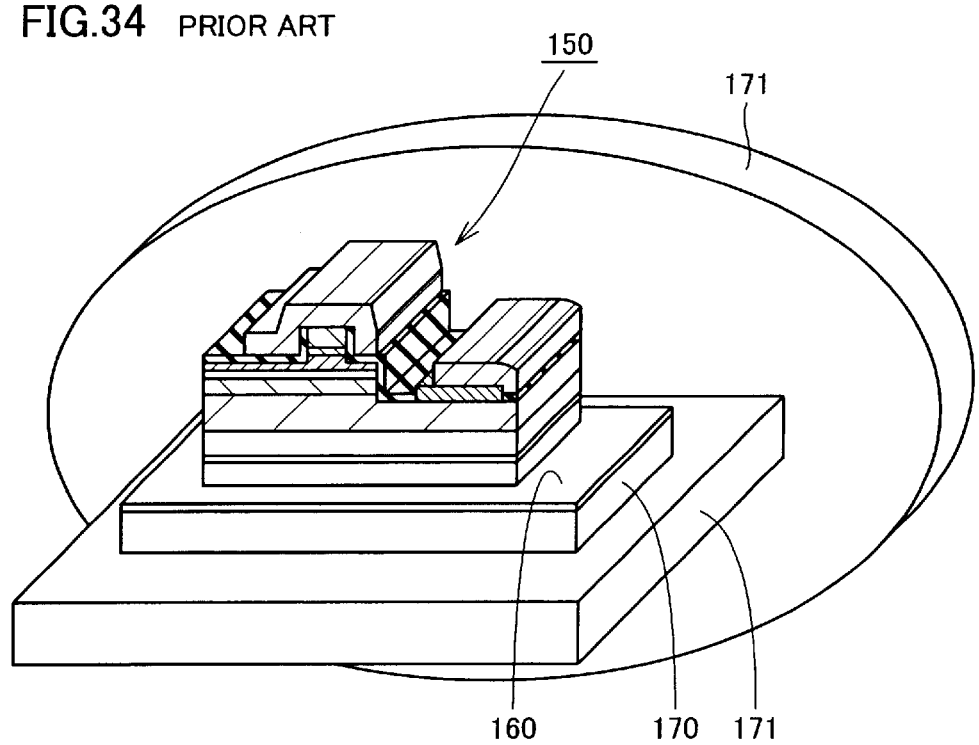
FIG. 34 is a perspective view of the conventional nitride-based semiconductor laser element shown in FIG. 28 in a state mounted on a submount in a junction-up system.

FIG. 27 shows the relation between the heat treatment temperatures for Pt and Pd and contact resistance. As clearly understood from FIG. 27, contact resistance of Pd is reduced when subjected to heat treatment at a temperature of about 400° C. On the other hand, contact resistance of Pt is not remarkably increased when subjected to heat treatment at the temperature of 400° C. According to the third embodiment, therefore, the heat treatment is performed at the temperature of about 400° C. for reducing contact resistance.

The uppermost Ni layer of the Pd-based electrode layer 33 is employed as an etching mask for etching the Pd-based layer 33, the Pt electrode layer 32, the p-type InGaN contact layer 31 and the p-type GaN contact layer 8 by anisotropic etching employing CF$_4$ gas while etching the p-type AlGaN cladding layer 7 by a thickness of about 150 nm. Thus, the ridge portion is formed as, shown in FIG. 25.

Figure 26:
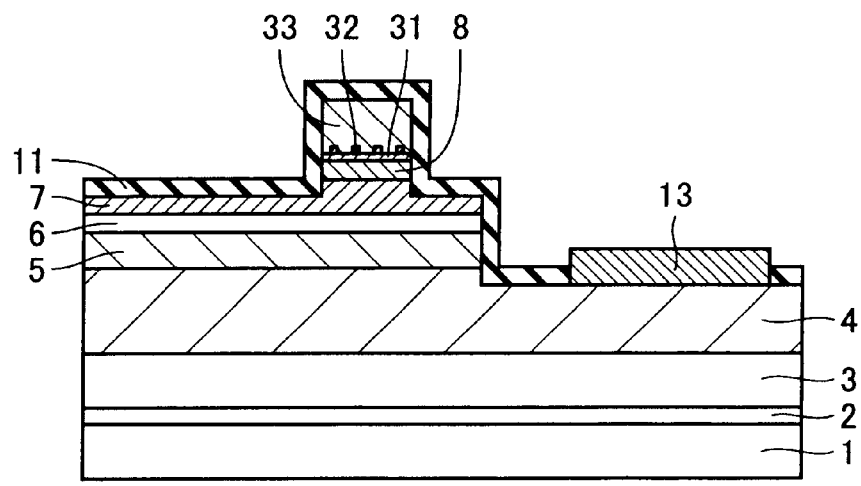

As shown in FIG. 26, the SiO$_2$ film 11 is deposited by plasma CVD, and thereafter partially removed from part of the n-type GaN contact layer 4. The n-side electrode 13 is formed on the part of the n-type GaN contact layer 4 from which the SiO$_2$ film 11 is removed.

Figure 19:
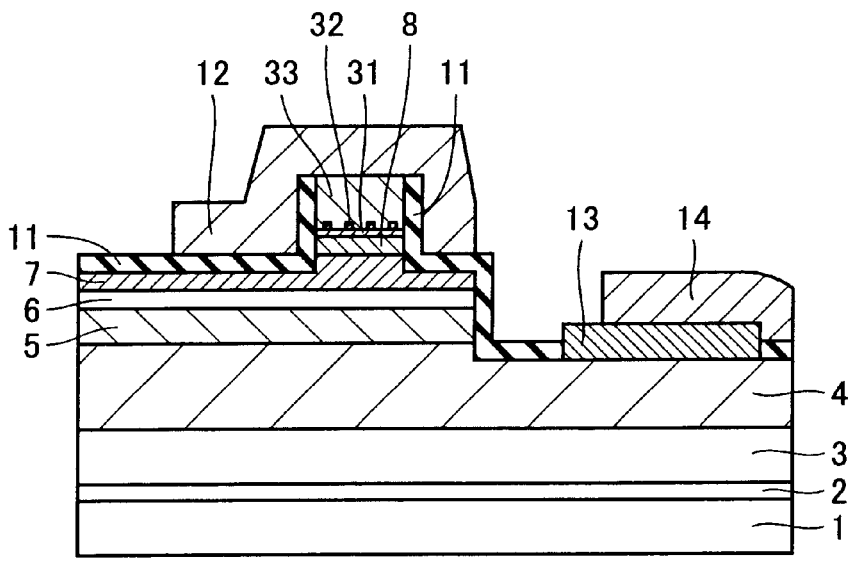
FIG. 19 is a sectional view showing a nitride-based semiconductor laser element according to a third embodiment of the present invention.

Finally, the SiO$_2$ film 11 is partially removed from the upper surface of the Pd-based electrode layer 33, followed by formation of the pad electrodes 12 and 14 on the Pd-based electrode layer 33 and the n-side electrode 13 respectively as shown in FIG. 19.

Thus, the nitride-based semiconductor laser element according to the third embodiment is formed.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned embodiments employs Pt as the material having strong adhesion to the nitride-based semiconductor layer (p-type GaN contact layer) and employs Pd as the material having low contact resistance (interfacial energy barrier) to the nitride-based semiconductor layer, the present invention is not restricted to this but other materials may alternatively be employed. For example, an alloy layer obtained by heat-treating Ni/Au, Co/Au or Cu/Au may be employed.

While each of the aforementioned embodiments has been described with reference the structure of a nitride-based semiconductor laser element employed as an exemplary nitride-based semiconductor light-emitting device and a method of forming the same, the present invention is not restricted to this but is also applicable to the structure of another nitride-based semiconductor light-emitting device such as an LED and a method of forming the same.

While both of the p-side electrode and the n-side electrode are provided on the surface of the nitride-based semiconductor laser element in each of the aforementioned embodiments, the present invention is not restricted to this but is also applicable to a structure having a p-side electrode provided on the surface of a nitride-based semiconductor laser element and an n-side electrode provided on the back surface thereof.

While the nitride-based semiconductor laser element 50 is assembled in the junction-down system in the aforementioned first embodiment, the present invention is not restricted to this but is also applicable to a case of assembling the nitride-based semiconductor laser element 50 in a junction-up system.

While the p-type InGaN layer 31 has the In composition of 15% and the thickness of 3 nm in the third embodiment, the present invention is not restricted to this but a p-type InGaN layer having an In composition of at least 3% and a thickness of not more than 20 nm can attain a similar effect with an irregularized surface.

What is claimed is:

1. A nitride-based semiconductor light-emitting device comprising:
    a nitride-based semiconductor layer formed on an active layer; and
    an electrode layer partially formed on said nitride-based semiconductor layer,
    said electrode layer including:
        a first electrode layer containing a material having strong adhesion to said nitride-based semiconductor layer, and
        a second electrode layer formed on said first electrode layer to have a portion coming into contact with the surface of said nitride-based semiconductor layer with weaker adhesion to said nitride-based semiconductor layer than said first electrode layer for reducing contact resistance of said electrode layer to said nitride-based semiconductor layer.

2. The nitride-based semiconductor light-emitting device according to claim 1, wherein
    said second electrode layer has lower contact resistance to said nitride-based semiconductor layer than said first electrode layer.

3. The nitride-based semiconductor light-emitting device according to claim 1, wherein
    said first electrode layer is formed by patterning.

4. The nitride-based semiconductor light-emitting device according to claim 1, wherein
    said nitride-based semiconductor layer includes a contact layer formed on a projection portion of a cladding layer, and
    said projection portion of said cladding layer and said contact layer form a ridge portion.

5. The nitride-based semiconductor light-emitting device according to claim 1, wherein
    said second electrode layer has a lower energy barrier to said nitride-based semiconductor layer than said first electrode layer.

6. The nitride-based semiconductor light-emitting device according to claim 1, wherein
    said first electrode layer contains at least one material selected from a group consisting of Pt, Ni, Cr, Ti, Hf and Zr, and
    said second electrode layer contains Pd.

7. The nitride-based semiconductor light-emitting device according to claim 6, wherein
    said first electrode layer includes a Pt layer, and
    said second electrode layer includes a multilayer film having a Pd layer.

8. The nitride-based semiconductor light-emitting device according to claim 1, wherein
    said first electrode layer is partially formed on said nitride-based semiconductor layer in heterogeneous distribution.

9. The nitride-based semiconductor light-emitting device according to claim 8, wherein
    said first electrode layer is formed on said nitride-based semiconductor layer with a thickness of not more than 3 nm.

10. The nitride-based semiconductor light-emitting device according to claim 1, wherein
    said nitride-based semiconductor layer has an irregular surface.

11. The nitride-based semiconductor light-emitting device according to claim 10, wherein
    said nitride-based semiconductor layer having said irregular surface has an In composition of at least 3% and a thickness of not more than 20 nm.

12. A nitride-based semiconductor light-emitting device comprising:
    a nitride-based semiconductor layer formed on an active layer; and
    an electrode layer formed on said nitride-based semiconductor layer,
    said electrode layer including:
        a first electrode layer containing a material having strong adhesion to said nitride-based semiconductor layer, and
        a second electrode layer formed on said first electrode layer to have a portion coming into contact with the surface of said nitride-based semiconductor layer with weaker adhesion to said nitride-based semiconductor layer than said first electrode layer for reducing an energy barrier of said electrode layer to said nitride-based semiconductor layer.

13. The nitride-based semiconductor light-emitting device according to claim 12, wherein
    said second electrode layer has lower contact resistance to said nitride-based semiconductor layer than said first electrode layer.

14. The nitride-based semiconductor light-emitting device according to claim 12, wherein
    said first electrode layer is formed by patterning.

15. The nitride-based semiconductor light-emitting device according to claim 12, wherein
    said nitride-based semiconductor layer includes a contact layer formed on a projection portion of a cladding layer, and said projection portion of said cladding layer and said contact layer form a ridge portion.

16. The nitride-based semiconductor light-emitting device according to claim 12, wherein said first electrode layer contains at least one material selected from a group consisting of Pt, Ni, Cr, Ti, Hf and Zr, and said second electrode layer contains Pd.

17. The nitride-based semiconductor light-emitting device according to claim 16, wherein said first electrode layer includes a Pt layer, and said second electrode layer includes a multilayer film having a Pd layer.

18. The nitride-based semiconductor light-emitting device according to claim 12, wherein said first electrode layer is partially formed on said nitride-based semiconductor layer in heterogeneous distribution.

19. The nitride-based semiconductor light-emitting device according to claim 18, wherein said first electrode layer is formed on said nitride-based semiconductor layer with a thickness of not more than 3 nm.

20. The nitride-based semiconductor light-emitting device according to claim 12, wherein said nitride-based semiconductor layer has an irregular surface.

21. The nitride-based semiconductor light-emitting device according to claim 20, wherein said nitride-based semiconductor layer having said irregular surface has an In composition of at least 3% and a thickness of not more than 20 nm.

* * * * *